(12) United States Patent
Fukui et al.

(10) Patent No.: US 9,192,058 B2
(45) Date of Patent: Nov. 17, 2015

(54) METHOD FOR MANUFACTURING COMPONENT BUILT-IN SUBSTRATE

(71) Applicant: FUJITSU LIMITED, Kawasaki-shi (JP)

(72) Inventors: Kei Fukui, Kamiminochi (JP); Koji Komemura, Nagano (JP); Hiromitsu Kobayashi, Nagano (JP); Mitsuo Denda, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/576,847

(22) Filed: Dec. 19, 2014

(65) Prior Publication Data
US 2015/0195918 A1 Jul. 9, 2015

(30) Foreign Application Priority Data
Jan. 8, 2014 (JP) .................. 2014-001916

(51) Int. Cl.
*H05K 3/30* (2006.01)
*H05K 3/10* (2006.01)
*H05K 3/02* (2006.01)

(52) U.S. Cl.
CPC .. *H05K 3/30* (2013.01); *H05K 3/02* (2013.01); *H05K 3/10* (2013.01)

(58) Field of Classification Search
USPC ........................................... 257/211
See application file for complete search history.

(56) References Cited

U.S. PATENT DOCUMENTS

| | | | | |
|---|---|---|---|---|
| 2005/0285147 A1* | 12/2005 | Usui | ..................... | H01L 23/142 257/202 |
| 2006/0207088 A1 | 9/2006 | Yamano | | |
| 2007/0268675 A1* | 11/2007 | Chinda | ............... | H01L 21/4853 361/748 |
| 2008/0099911 A1* | 5/2008 | Machida | ................. | H01L 23/13 257/723 |

FOREIGN PATENT DOCUMENTS

| | | |
|---|---|---|
| JP | 2004-296562 | 10/2004 |
| JP | 2006-261245 | 9/2006 |
| JP | 2007-150002 | 6/2007 |

* cited by examiner

*Primary Examiner* — Thao P Le
(74) *Attorney, Agent, or Firm* — Fujitsu Patent Center

(57) ABSTRACT

A method for manufacturing a component built-in substrate is disclosed, which can attain high densities of components and wirings. The method includes: mounting electronic components on a predetermined member with its surface being provided with a first layer enabled to be exfoliated; stacking a second layer to fill the electronic components further on the first layer; exfoliating and removing the predetermined member from a stacked body configured by stacking the second layer on the first layer; and forming a via to penetrate the first layer and conduct to the electronic components from a surface of the surfaces of the stacked body, from which the predetermined member is removed.

12 Claims, 6 Drawing Sheets

METHOD FOR MANUFACTURING COMPONENT BUILT-IN SUBSTRATE

CROSS-REFERENCE TO RELATED APPLICATION

This application is based upon and claims the benefit of priority of the prior Japanese Patent Application No. 2014-001916, filed on Jan. 8, 2014, the entire contents of which are incorporated herein by reference.

FIELD

The present application relates to a method for manufacturing a component built-in substrate.

BACKGROUND

Electronic equipment has been increasingly downsized. In recent years, electronic component built-in substrate have been proposed by way of technologies of downsizing the electronic equipment (refer to, e.g., Patent documents 1-3).

Patent Document

[Patent document 1] Japanese Patent Application Laid-Open Publication No. 2007-150002
[Patent document 2] Japanese Patent Application Laid-Open Publication No. 2006-261245
[Patent document 3] Japanese Patent Application Laid-Open Publication No. 2004-296562

SUMMARY

The present application discloses a method for manufacturing a component built-in substrate that follows. The method of manufacturing a component built-in substrate, includes: mounting electronic components on a predetermined member with its surface being provided with a first layer enabled to be exfoliated; stacking a second layer to fill the electronic components further on the first layer; exfoliating and removing the predetermined member from a stacked body configured by stacking the second layer on the first layer; and forming a via to penetrate the first layer and conduct to the electronic components from a surface of the surfaces of the stacked body, from which the predetermined member is removed.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

An embodiment will hereinafter be described. The embodiment, which will be illustrated below, is a mere exemplification, but the technical scope of the present disclosure is not limited to the following aspect.

Figure 1:
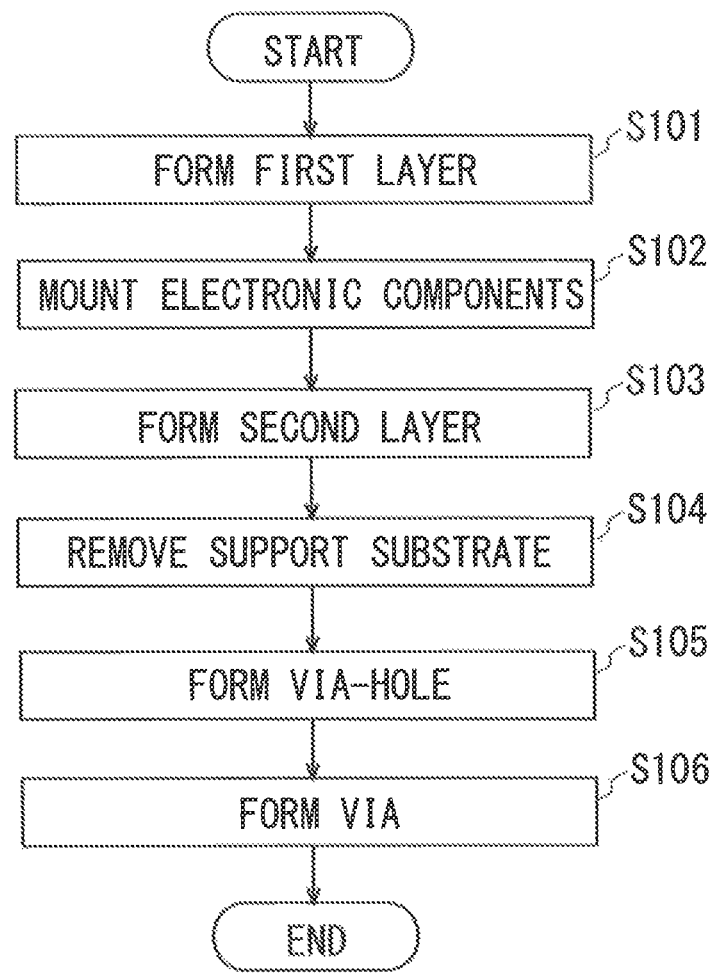
FIG. 1 is one example of a flowchart illustrating respective steps of a method for manufacturing a component built-in substrate according to an embodiment.

FIG. 1 is one example of a flowchart illustrating respective steps of a method for manufacturing a component built-in substrate according to the embodiment. The respective steps of the method for manufacturing the component built-in substrate according to the embodiment, will be described along with the flowchart illustrated in FIG. 1.

Figure 2:
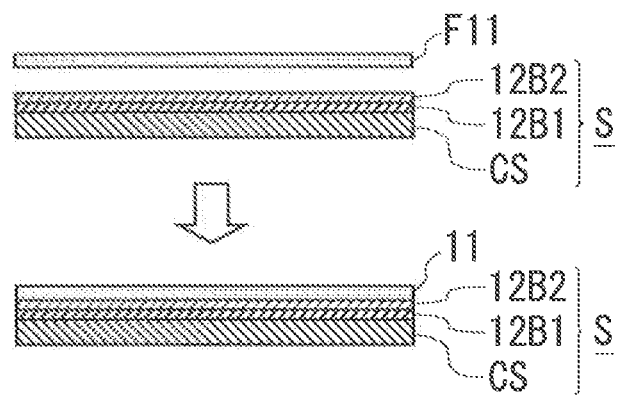
FIG. 2 is one example of a view illustrating a step of forming a first layer.

FIG. 2 is one example of a view illustrating a step of forming a first layer (which is one example of an "insulating layer" connoted in the present application). The present manufacturing method involves executing a step (S101) of providing a first layer 11 on the surface of a support substrate S (which is one example of a "predetermined member" connoted in the present application). The first layer 11 configures apart of the component built-in substrate defined as a manufactured product by the present manufacturing method. The first layer 11 is composed of, e.g., an insulating member. The first layer 11 can be provided on the surface of the support substrate S by pasting a film F11 composed of, e.g., an insulating resin exhibiting electric insulating properties.

The first layer 11 is provided in an exfoliation-enabled state on the surface of the support substrate S. The first layer 11 is, e.g., as illustrated in FIG. 2, provided on the surface of the support substrate S configured by stacking a pasted exfoliative copper foil formed by pasting two copper foil sheets 12B1, 12B2 together in the exfoliation-enabled state, on a core substrate CS. When the copper foils 12B1, 12B2 are bonded together by a bonding agent, the first layer 11 can be exfoliated from the support substrate S by use of a release agent acting to weaken adhesivity of the bonding agent. Further, when the copper foils 12B1, 12B2 are pasted together via physical adhesion, the first layer 11 can be exfoliated from the support substrate S by applying force acting in such a direction as to separate the first layer 11 and the support substrate S from each other.

Note that the present manufacturing method is not limited to the method for providing the first layer 11 on the surface of the tabular support substrate S. In the present manufacturing method, for example, the first layer 11 may be provided on the surface of a non-tabular member.

Moreover, the present manufacturing method is not limited to the configuration that the first layer 11 is provided on the surface of the support substrate S configured by stacking the exfoliative copper foil formed by pasting the two copper foil sheets 12B1, 12B2 together. The present manufacturing method may adopt a configuration that the first layer 11 is provided on any type of member if the first layer 11 can be exfoliated from the member provided with the first layer 11.

Figure 3:
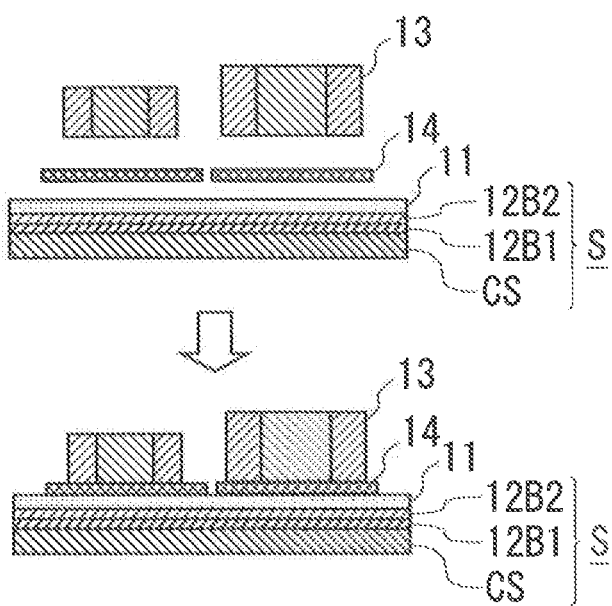
FIG. 3 illustrates one example of a view depicting the a step of mounting the electronic components.

FIG. 3 illustrates one example of a view depicting a step of mounting the electronic components. The present manufacturing method, after forming the first layer 11, includes executing a step (S102) of mounting electronic components 13. The electronic components 13 are components to be built in the component built-in substrate defined as the manufactured product by the present manufacturing method, and, e.g., a variety of electronic components such as resistors and capacitors can be applied as the electronic components 13. The first layer 11 is composed of the material configuring apart of the component built-in substrate as the manufactured product by the present manufacturing method, and is therefore preferably bonded to the electronic components 13. The electronic components 13 can be bonded to the first layer 11 by heating a bonding sheet 14 containing a bonding agent having a thermosetting property in a state of its being sandwiched in between the electronic components 13 and the first layer 11.

It is to be noted that the number of the electronic components 13 to be mounted is not limited to "2" as illustrated in FIG. 3 but may be "1" or "3 and over". When two or a larger number of electronic components 13 are mounted, the respective electronic components 13 may be mutually different and may also be the same in terms of their shapes and sizes.

Furthermore, the electronic components 13 are not, as illustrated in FIG. 3, confined to the components bonded by use of the bonding sheet 14 prepared per electronic component 13 but may be bonded by employing a bonding sheet that covers the entire first layer 11. Moreover, the electronic components 13 are not limited to the components bonded by using the bonding sheet 14 but may also be bonded by employing, e.g., a liquid bonding agent coated over the first layer 11 or the electronic components 13.

Figure 4:
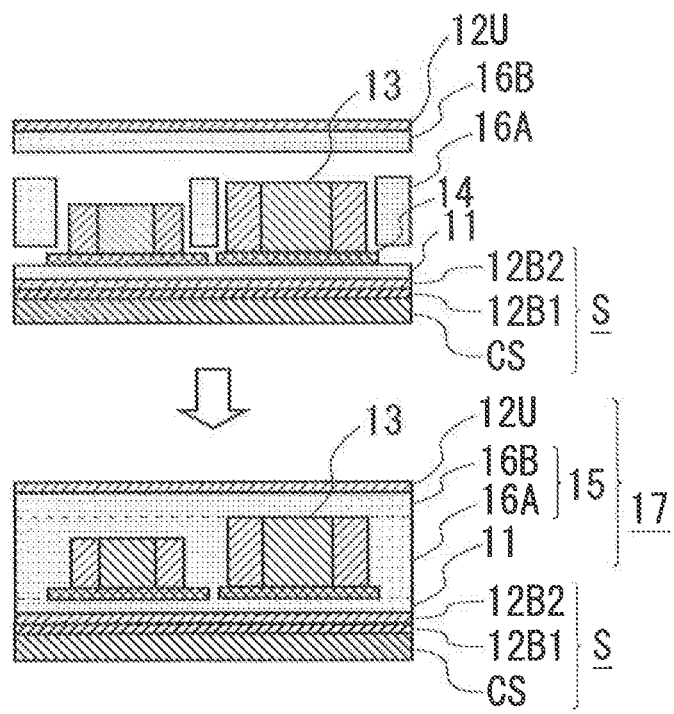
FIG. 4 illustrates one example of a view depicting a step of forming a second layer.

FIG. 4 illustrates one example of a view depicting a step of forming a second layer. The present manufacturing method includes executing a step (S103) of forming a second layer 15 after mounting the electronic components 13. The second layer 15 configures a part of the component built-in substrate as the manufactured product by the present manufacturing method. The second layer 15 is composed of, e.g., the insulating member. The second layer 15 has, e.g., the electric insulating property. The second layer 15 can be formed by stacking: a core member 16A defined as a tabular member of which portions corresponding to the electronic components 13 are removed; and a core member 16B defined as a tabular member covering the entire core member 16A, and causing an uncured fluid resin to permeate into a gap therebetween. A member, which is thicker than the first layer 11, can be applied to the core member 16A. Hence, a stacked body 17 configured by stacking the core member 16A and the core member 16B on the first layer 11 reaches such a state that a structural strength is ensured mainly by the core member 16A.

Note that the core member 16B with its surface being formed with the copper foil 12U is illustrated in FIG. 4, however, the copper foil 12U may not be formed on the core member 16B. When wirings of the component built-in substrate are arranged on only a single surface of the substrate, the copper foil 12U may be omitted from the core member 16B.

Figure 5:
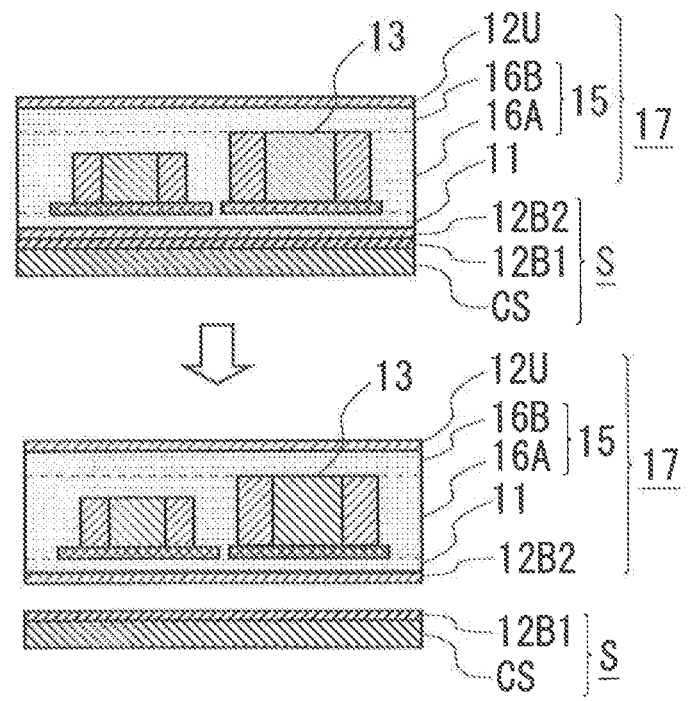
FIG. 5 illustrates one example of a view depicting a step of exfoliating and thus removing a support substrate.

FIG. 5 illustrates one example of a view depicting a step of exfoliating and thus removing the support substrate S. The present manufacturing method includes executing a step (S104) of exfoliating and thus removing the support substrate S after the second layer 15 has been formed. On the occasion of exfoliating and removing the support substrate S, a copper foil 12B1 and a copper foil 12B2, which are bonded or adhered, are exfoliated from each other, thereby removing the support substrate S. For example, when the copper foils 12B1, 12B2 are pasted together by the bonding agent, the support substrate S is removed by use of the release agent to weaken the adhesivity of the bonding agent. Further, when the copper foils 12B1, 12B2 are pasted together by the physical adhesion, the support substrate S is removed by applying the force acting in such a direction as to separate the stacked body 17 and the support substrate S from each other.

On the occasion of removing the support substrate S, the copper foil 12B1 and the copper foil 12B2 are exfoliated from each other, and hence the conductive copper foil 12B2 (which is one example of a "conductive layer" connoted in the present application) remains formed adjacent to the first layer 11 on the stacked body 17 from which the support substrate S is removed.

The core member 16A etc being thicker than the first layer 11 is stacked on the stacked body 17, thereby already ensuring the structural strength. Accordingly, even when the support substrate S is removed from the stacked body 17, the stacked body 17 does not get deformed due to self-weights of the built-in electronic components 13 and other members.

Figure 6:
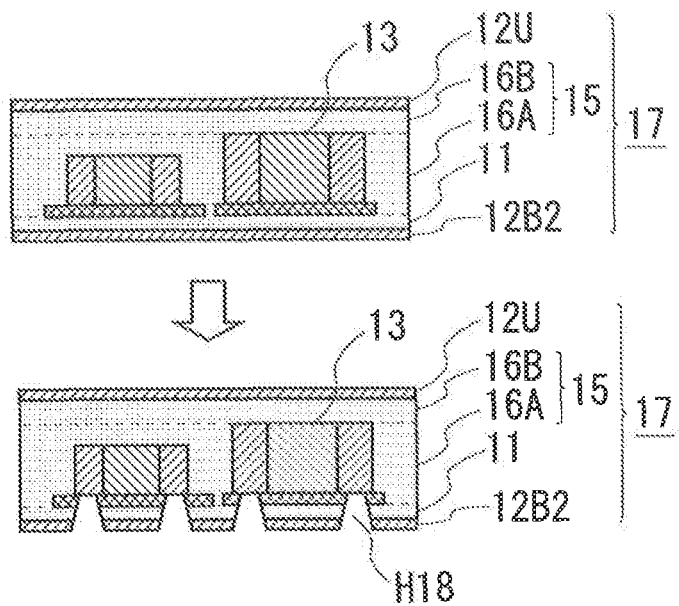
FIG. 6 illustrates one example of a view depicting a step of forming a via-hole.

FIG. 6 illustrates one example of a view depicting a step of forming a via-hole. The present manufacturing method includes executing, after the support substrate S has been removed, a step (S105) of forming a via-hole H18 (which is one example of a "hole" connoted in the present application) penetrating the first layer 11 from the surface of the surfaces of the stacked body 17 up to the electronic components 13. The via-hole H18 can be formed by employing, e.g., a laser. Every electronic component 13 is mounted on the flat first layer 11, and therefore depths extending from the surface of the stacked body 17 to the respective electronic components 13 are the same. Hence, each via-hole H18 can be formed by laser beam machining under the same condition.

Figure 7:
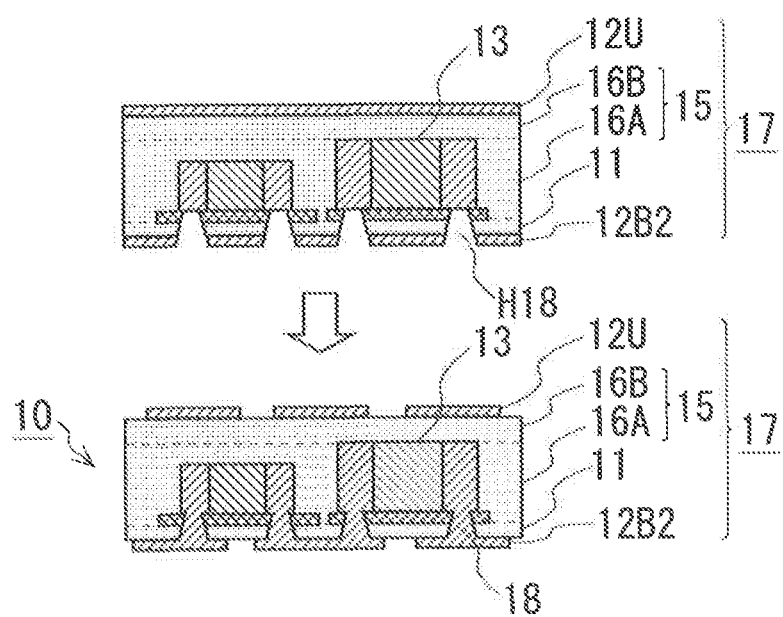
FIG. 7 illustrates one example of a view depicting a step of forming a via.

FIG. 7 is a view illustrating one example of a view depicting a step of forming a via. The present manufacturing method includes executing a step (S106) of forming a via 18 after the via-hole H18 has been formed. The via 18 can be formed by filling the via-hole H18 with a conductive material in the way of performing, e.g., via Fill plating. The component built-in substrate 10 reaches it completion by patterning the wirings after the via Fill plating.

The respective steps of the method for manufacturing the component built-in substrate according to the embodiment are as described above.

The electronic components 13 mounted on the first layer 11 are supported via the first layer 11 on the support substrate S. Hence, the first layer 11 may not have a strength enough to withstand treatments such as pasting the electronic components 13 in the manufacturing steps. Accordingly, the first layer 11 can be made thinner than in the case of enabling the electronic components 13 to be pasted without using the support substrate S. For example, thickness of the first layer 11 can be minimized for ensuring electric insulating performance requested of the component built-in substrate 10. The manufacturing method according to the embodiment enables the first layer 11 to be thinner than in the case of applying a manufacturing method not using the support substrate S. The thickness of the first layer 11 can therefore make it hard to restrict a diameter of the hole from being diminished, the hole extending from the surface of the component built-in substrate 10 to the electronic components 13 in the interior of the substrate.

One example of the manufacturing method not using the support substrate S will hereinafter be described.

Figure 8:
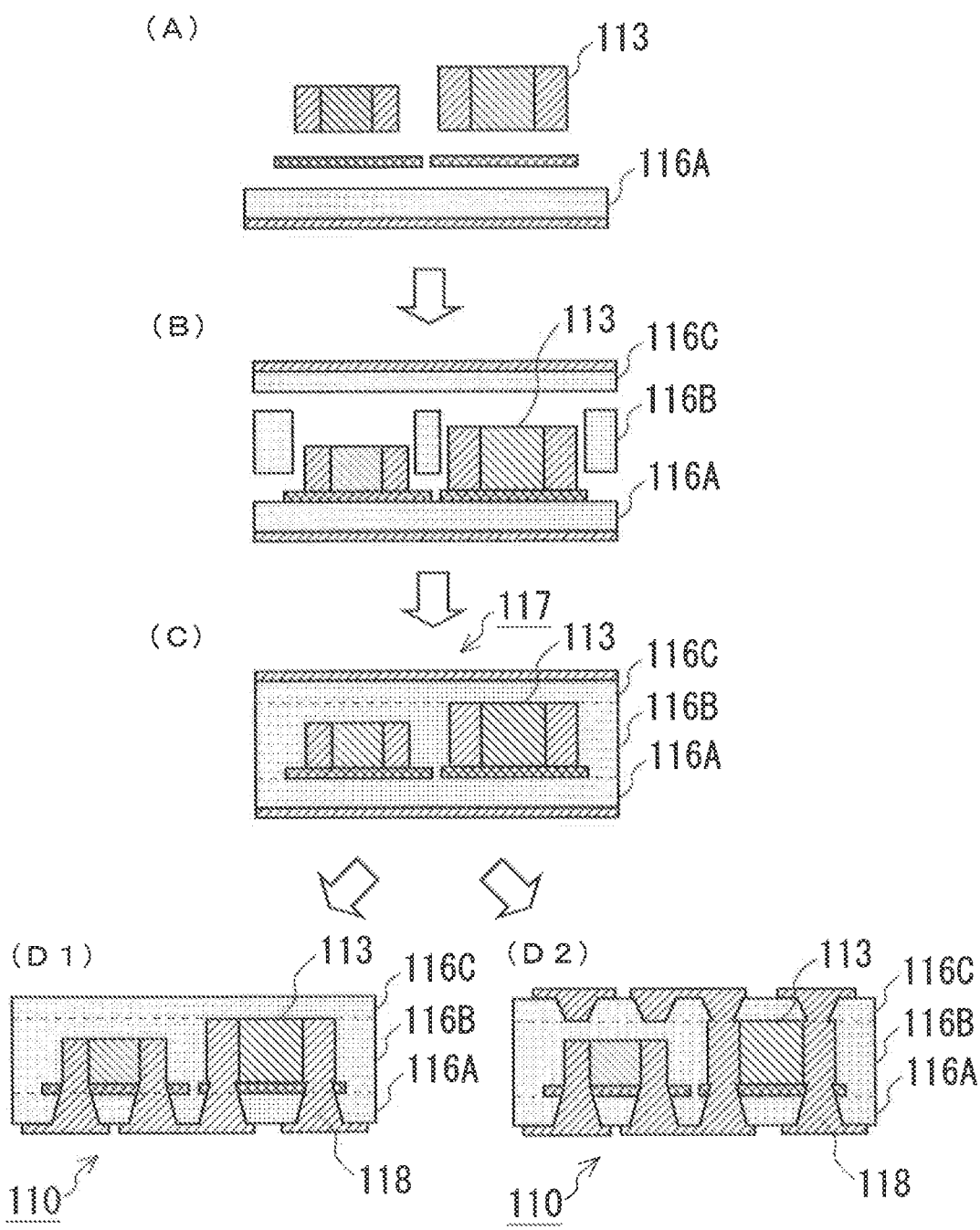
FIG. 8 illustrates one example of a view depicting respective steps of a method for manufacturing a component built-in substrate according to a comparative example.

FIG. 8 illustrates one example of a view depicting the respective steps of the method for manufacturing the component built-in substrate according to a comparative example. In the manufacturing method according to the comparative example, electronic components 113 are mounted on a tabular core member 116A having the electric insulating property (see FIG. 8(A)). Next, there are prepared a core member 116B defined as a tabular member of which portions corresponding to the electronic components 113 are removed; and a core member 116C defined as a tabular member covering the entire core member 116B (see FIG. 8(B)). Then, the core members 116B, 116C are stacked on the core member 116A, and a stacked body 117 is formed by causing the uncured resin to permeate into gaps therebetween, thereby configuring the stacked body 117 (see FIG. 8(C)). Subsequently, a via 118 extending from a lower surface of the stacked body 117 to each of the electronic components 113 is formed (see FIG. 8(D1)). Alternatively, the via 118 extending from both of an upper surface and the lower surface of the stacked body 117 to each of the electronic components 113 is formed (see FIG. 8(D2)), thus reaching a completion of a component built-in substrate 100.

Figure 9:
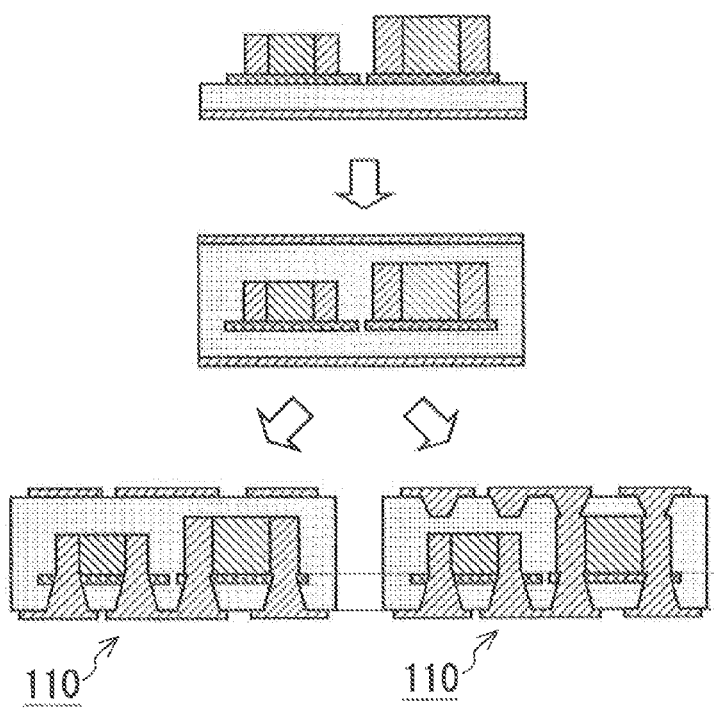
FIG. 9 illustrates one example of a view depicting a comparison between lengths of the vias.
Figure 9:
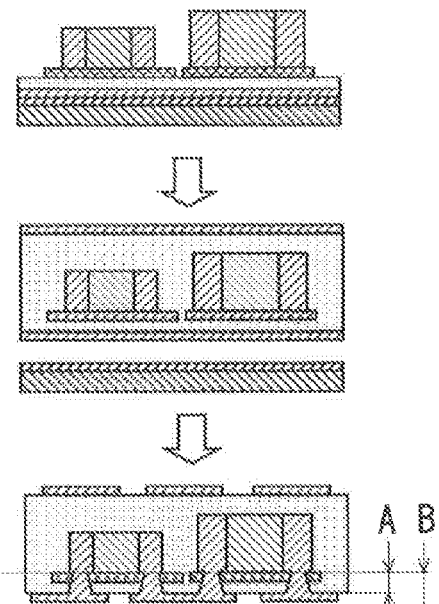

FIG. 9 illustrates one example of a view depicting a comparison between lengths of the vias. In FIG. 9, a dimension indicated by a symbol A represents the length of the via 18 of the component built-in substrate 10 manufactured by the manufacturing method according to the embodiment. Further in FIG. 9, a dimension indicated by a symbol B represents the length of the via 118 of the component built-in substrate 100 manufactured by the manufacturing method according to the comparative example. As apparent from the comparison between the dimension indicated by the symbol A and the dimension indicated by the symbol B, the length of the via 18 of the component built-in substrate 10 manufactured by the manufacturing method according to the embodiment is shorter than the length of the via 118 of the component built-in substrate 100 manufactured by the manufacturing method according to the comparative example. Hence, the manufacturing method according to the embodiment facilitates reducing the diameter of the via and also attaining higher density of the components and the wirings as compared with the manufacturing method according to the comparative example.

A general type of laser apparatus used for manufacturing the substrate is capable of, though depending on performance of the laser apparatus to be applied, forming the via 18 having a diameter of approximately 50 μm when using: a film of an insulating resin being 30 μm in thickness as the film F11 on the occasion of forming, e.g., the first layer 11; a bonding sheet being approximately 10 μm in thickness as the bonding sheet 14 for bonding the electronic components 13; and a copper foil being approximately 5 μm as the copper foil 12B2.

On the other hand, when manufacturing the component built-in substrate by the manufacturing method according to the comparative example, it is difficult to reduce the diameter of the via. For example, when a material containing a fiber-mixed reinforcing agent to be used for a purpose of ensuring the strength is employed as the core member 116A, the mixture of the material being different in terms of a physical property affects the laser beams, thereby making it further difficult to reduce the diameter of the via 118.

The method for manufacturing the component built-in substrate according to the embodiment does not require applying the high-strength material containing the reinforcing agent for the first layer 11 because the first layer 11 mounted with the electronic components 113 is supported on the support substrate S. Hence, the high densities of the components and the wirings can be attained by reducing the thickness of the first layer 11.

When manufacturing the electronic component built-in substrate, the substrate is provided with holes extending from a surface of the component built-in substrate to electronic components in an interior of the substrate, and wirings on the substrate surface are electrically connected via the holes to the electronic components. The component built-in substrate can be manufactured by preparing, e.g., a tabular member defined as a material configuring a part of the substrate, and pasting the electronic components and other materials to the tabular member in a tabular shape.

By the way, a strength enough to withstand treatments in manufacturing steps such as pasting at least the electronic components is requested of the tabular member to which the electronic components are pasted. Hence, when realizing electric connections by providing holes in the tabular member to which the electronic components are pasted, the holes extending from the surface of the substrate to the electronic components in the interior of the substrate, a thickness of the tabular member restricts a reduction in diameter of the hole as the case may be. If restricting the reduction in diameter of each of the holes extending from the surface of the component built-in substrate to the electronic components in the interior of the substrate, it is difficult to attain the high densities of the components and the wirings as the case may be.

The disclosure is capable of attaining the high densities of the components and the wirings.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a component built-in substrate, comprising:
   mounting electronic components on a predetermined member with its surface being provided with a first layer enabled to be exfoliated;
   stacking a second layer to fill the electronic components further on the first layer;
   exfoliating and removing the predetermined member from a stacked body configured by stacking the second layer on the first layer; and
   forming a via to penetrate the first layer and conduct to the electronic components from a surface of the surfaces of the stacked body, from which the predetermined member is removed.

2. The method of manufacturing the component built-in substrate according to claim 1, wherein a tabular member of which portions corresponding to the electronic components are removed is stacked on the predetermined member when stacking the second layer.

3. The method of manufacturing the component built-in substrate according to claim 1, wherein the predetermined member is a tabular support substrate to support the stacked body.

4. The method of manufacturing the component built-in substrate according to claim 2, wherein the predetermined member is a tabular support substrate to support the stacked body.

5. The method of manufacturing the component built-in substrate according to claim 1, wherein a conductive layer is formed adjacent to the first layer, and the forming of the via includes forming a via to penetrate the first layer and conduct to the electronic components and to the conductive layer from the surface, with the predetermined member being removed, of the surfaces of the stacked body.

6. The method of manufacturing the component built-in substrate according to claim 2, wherein a conductive layer is formed adjacent to the first layer, and the forming of the via includes forming a via to penetrate the first layer and conduct to the electronic components and to the conductive layer from the surface, with the predetermined member being removed, of the surfaces of the stacked body.

7. The method of manufacturing the component built-in substrate according to claim 3, wherein a conductive layer is formed adjacent to the first layer, and the forming of the via includes forming a via to penetrate the first layer and conduct to the electronic components and to the conductive layer from the surface, with the predetermined member being removed, of the surfaces of the stacked body.

8. The method of manufacturing the component built-in substrate according to claim 4, wherein a conductive layer is formed adjacent to the first layer, and the forming of the via includes forming a via to penetrate the first layer and conduct to the electronic components and to the conductive layer from the surface, with the predetermined member being removed, of the surfaces of the stacked body.

9. The method of manufacturing the component built-in substrate according to claim 5, wherein a wiring pattern is further formed on the conductive layer.

10. The method of manufacturing the component built-in substrate according to claim 6, wherein a wiring pattern is further formed on the conductive layer.

11. The method of manufacturing the component built-in substrate according to claim 7, wherein a wiring pattern is further formed on the conductive layer.

12. The method of manufacturing the component built-in substrate according to claim 8, wherein a wiring pattern is further formed on the conductive layer.

* * * * *